US009006975B2

(12) United States Patent
Dong et al.

(10) Patent No.: US 9,006,975 B2
(45) Date of Patent: *Apr. 14, 2015

(54) APPARATUS AND METHOD FOR REMOVAL OF SURFACE OXIDES VIA FLUXLESS TECHNIQUE INVOLVING ELECTRON ATTACHMENT

(75) Inventors: Chun Christine Dong, Macungie, PA (US); Russell A. Siminski, Zionsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 182 days.

This patent is subject to a terminal disclaimer.

(21) Appl. No.: 13/364,925

(22) Filed: Feb. 2, 2012

(65) Prior Publication Data

US 2013/0026921 A1    Jan. 31, 2013

Related U.S. Application Data

(60) Provisional application No. 61/441,053, filed on Feb. 9, 2011, provisional application No. 61/563,112, filed on Nov. 23, 2011.

(51) Int. Cl.
*H01J 7/24* (2006.01)
*B23K 1/20* (2006.01)
(Continued)

(52) U.S. Cl.
CPC .............. *B23K 1/203* (2013.01); *B01J 19/088* (2013.01); *B23K 35/38* (2013.01); *C23G 5/024* (2013.01); *H01L 2924/0002* (2013.01)

(58) Field of Classification Search
USPC ........................................ 315/111.51–111.81
See application file for complete search history.

(56) References Cited

U.S. PATENT DOCUMENTS 2,909,662 A    10/1959    Von Hippel
5,124,664 A *  6/1992    Cade et al. ...................... 330/45
(Continued)

FOREIGN PATENT DOCUMENTS

CN    101740345 A    6/2010
DE    198 15 703 A1    10/1999
(Continued)

OTHER PUBLICATIONS

N. Potier, et al, Fluxless Soldering Under Activated Atmosphere At Ambient Pressure, Surface Mount International Conference, 1995, San Jose, CA.

*Primary Examiner* — Douglas W Owens
*Assistant Examiner* — Srinivas Sathiraju
(74) *Attorney, Agent, or Firm* — Rosaleen P. Morris-Oskanian; Amy Carr-Trexler

(57) ABSTRACT

Described herein is a method and apparatus for removing metal oxides on a surface of a component via electron attachment. In one embodiment, there is provided a field emission apparatus, wherein the electrons attach to at least a portion of the reducing gas to form a negatively charged atomic ions which removes metal oxides comprising: a cathode comprising an electrically conductive and comprising at least one or more protrusions having a high surface curvature, wherein the cathode is surrounded by a dielectric material which is then surrounded by an electrically conductive anode wherein the cathode and anode are each connected to an electrical voltage source, and the dielectric material between the cathode and anode is polarized to provide an electric field at one or more protrusions and thereby electrons from the cathode.

6 Claims, 3 Drawing Sheets

(51) Int. Cl.
  *B01J 19/08*  (2006.01)
  *B23K 35/38*  (2006.01)
  *C23G 5/024*  (2006.01)

(56) References Cited

U.S. PATENT DOCUMENTS

| | | | |
|---|---|---|---|
| 5,409,543 | A | 4/1995 | Panitz et al. |
| 5,433,820 | A | 7/1995 | Sindzingre et al. |
| 5,722,581 | A | 3/1998 | Sindzingre et al. |
| 5,858,312 | A | 1/1999 | Sindzingre et al. |
| 5,941,448 | A | 8/1999 | Sindzingre et al. |
| 6,007,637 | A | 12/1999 | Sindzingre et al. |
| 6,021,940 | A | 2/2000 | Sindzingre et al. |
| 6,089,455 | A | 7/2000 | Yagita |
| 6,146,503 | A | 11/2000 | Sindzingre et al. |
| 6,203,637 | B1 | 3/2001 | Dommann et al. |
| 7,079,370 | B2 * | 7/2006 | Dong et al. .................. 361/230 |
| 7,239,076 | B2 * | 7/2007 | Lee et al. ..................... 313/497 |
| 7,883,602 | B2 * | 2/2011 | Dong et al. .............. 156/345.51 |
| 7,897,029 | B2 * | 3/2011 | Dong et al. .................. 205/684 |
| 8,119,016 | B2 * | 2/2012 | Dong et al. ..................... 216/13 |
| 8,361,340 | B2 * | 1/2013 | Dong et al. ..................... 216/63 |
| 2006/0176641 | A1 | 8/2006 | Gefter et al. |
| 2007/0072433 | A1 | 3/2007 | Yoon et al. |
| 2009/0236236 | A1 * | 9/2009 | Dong et al. ................... 205/766 |
| 2011/0180149 | A1 * | 7/2011 | Fine et al. ......................... 137/1 |
| 2013/0026921 | A1 * | 1/2013 | Dong et al. ............. 315/111.81 |
| 2013/0187547 | A1 * | 7/2013 | Dong et al. ............. 315/111.81 |

FOREIGN PATENT DOCUMENTS

| | | |
|---|---|---|
| DE | 19815703 A1 | 10/1999 |
| EP | 1276130 A2 | 1/2003 |
| EP | 1 473 105 A2 | 11/2004 |
| GB | 1394125 A | 5/1975 |
| JP | 2003-086330 A | 3/2003 |
| JP | 2003086330 A2 | 3/2003 |

* cited by examiner

APPARATUS AND METHOD FOR REMOVAL OF SURFACE OXIDES VIA FLUXLESS TECHNIQUE INVOLVING ELECTRON ATTACHMENT

CROSS-REFERENCE TO RELATED APPLICATIONS

This application claims the benefit of U.S. Provisional Application Nos. 61/441,053, filed 9 Feb. 2011 and 61/563,112 filed 23 Nov. 2011.

BACKGROUND OF THE INVENTION

The present invention relates generally to fluxless processes for removing surface oxides. More specifically, the invention relates to an apparatus and method comprising same for fluxless reflow and soldering involving electron attachment and field emission at ambient (e.g., non vacuum) pressure.

Reflow and soldering are important processing steps in the assembly of electronic components for making solder joints. The term "reflow" as used herein refers to a process for making a previously applied solder melt and flow upon application of an energy source such as, for example, thermal energy. The term "soldering" as used herein refers to a process that allows a melted solder to join at least two metallic substrates. A variety of different reflow and soldering processes may be used in the assembly of electronic devices, such as, but not limited to, reflow of solder bumps used for wafer bumping, reflow soldering used in the assembly of surface-mount electronic components, and wave soldering used in the assembly of insertion-mount components.

Reflow soldering is a process used for outer lead bonding of surface-mount components wherein a chip is transferred with leads in place to the next-level surface mount packages. In the reflow soldering process, components are mounted on the corresponding trace area of a circuit board with a solder paste previously printed on the circuit board. Such formed soldering parts are then loaded into a reflow furnace and passed through heating and cooling zones. Solder joints between component leads and solder lands on the circuit board are formed by melting, wetting, and solidifying the solder paste. To ensure a good wetting of the molten solder on the joining surfaces, organic fluxes are normally contained in the solder pastes to remove initial surface oxides on both solder and base metal and to keep the surfaces in a clean state before solidification. The fluxes are mostly evaporated into vapor phase during soldering; however, the flux volatiles may cause problems, such as forming voids in the solder joints and contaminating the reflow furnace. After soldering, flux residues still remain on the circuit board that can cause corrosion and electric shorts.

Wave soldering is also used for outer lead bonding such as for assembling traditional insertion mount components. It also can be used for surface-mount components by temporarily bonding the components on the circuit board by an adhesive before soldering. For both cases, the circuit boards with components inserted or temporarily bonded have to be cleaned by using a liquid flux to remove oxides on the component leads and solder lands and then passed through a high temperature molten solder bath. The molten solder automatically wets the metal surfaces to be soldered and solder joints are thus formed. The molten solder in the bath has a high tendency to be oxidized, forming solder dross. Therefore the surface of the solder bath has to be frequently cleaned by mechanically removing the dross, which increases the operation cost and the consumption of the solder. After soldering, flux residues remain on the circuit boards, which brings the same problems as described herein for reflow soldering.

Wafer bumping is a process used to make thick metal bumps on the chip bond pads for inner lead bonding. The bumps are commonly made by depositing a solder on the pads and then reflowing (referred to herein as a first reflow) to conduct alloying and to change the shape of the solder bump from a mushroom-shape into a hemispherical-shape. The chip with the first-reflowed bumps is "flipped" to correspond to the footprint of the solder wettable terminals on the substrate and then subjected to a second reflow to form solder joints. These solder joints are referred to herein as inner lead bonds. High-melting point solders (e.g., >300° C.) are normally used in the wafer bumping process because it allows for subsequent assembly steps such as outer lead bonding to proceed using lower-melting point solders (e.g., <230° C.) without disruption of the inner lead bonds.

The shape of the solder bumps after the first reflow is critical. For example, a large bump height is preferable for better bonding and higher fatigue resistance. Further, the bumps formed should preferably be substantially uniform to ensure planarity. Substantially uniform solder bumps having relatively larger bump heights is believed to be associated with an oxide-free bump surface during the first reflow. One approach for removing solder oxides during the first reflow of the solder bumped wafer is applying organic fluxes over the deposited solder bumps, or within a solder paste mixture that has been printed onto the wafer to form the bumps, and reflowing the bumps in an inert environment so that the fluxes can effectively remove initial oxides on the solder surface. However, this approach has its drawbacks. Small voids may form in the solder bumps due to flux decomposition. These voids may not only degrade the electrical and mechanical properties of the formed solder bonds but also destroy the co-planarity of the solder bumped wafer and affect the subsequent chip bonding process. The decomposed flux volatiles can also contaminant the reflow furnace which can increase the maintenance cost. In addition, flux residues are oftentimes left upon the wafer which can cause corrosion and degrade the performance of the assembly.

To remove the flux residues from the reflow and soldering processes described above, a post cleaning process may be adopted using chlorofluorcarbons (CFCs) as cleaning agents. However, post-cleaning adds an additional process step and increases the manufacturing processing time. Further, the use of chlorofluorocarbons (CFCs) as cleaning agents is banned due to the potential damage to the earth's protective ozone layer. Although no-clean fluxes have been developed by using a small amount of activators to reduce residues, there is a trade-off between the gain and loss in the amount of flux residues and the activity of the fluxes.

A good solution to all the problems described above, including void formation, flux volatiles, flux residues, and dross formation, is using a reducing gas as a reflow and soldering environment to replace organic fluxes for removing metal oxides. Such reflow and soldering techniques are called "fluxless reflow" and "fluxless soldering". Among various fluxless reflow and soldering methods, the use of hydrogen as a reactive gas to reduce oxides on base metals and solders is especially attractive because it is a very clean process (the only by-product is water which can be easily ventilated out of the furnace), and it can be compatible with an open and continued soldering production line ($H_2$ is non-toxic and has a flammable range of 4 to 75%). Therefore, hydrogen fluxless soldering has been a technical goal for a long time.

One previously used hydrogen fluxless method for inner lead bonding has been to employ pure hydrogen for reflow of the solder bumped wafer at temperatures ranging from 400 to 450° C. However, the flammable nature of the pure hydrogen largely limits its application. For soldering processes used in outer lead bonding, such as reflow soldering and wave soldering, the major limitation of using hydrogen to reduce surface oxides is the inefficient and slow reduction rate of metal oxides at the normal processing temperature ranges (<250° C.), especially for solder oxides, which have higher metal-oxygen bond strengths than that of the oxides on the base metals to be soldered. This inefficiency of hydrogen is attributed to the lack of reactivity of the hydrogen molecule at low temperatures. Highly reactive radicals, such as monoatomic hydrogen, form at temperatures much higher than the normal reflow soldering and wave soldering temperature range. For example, the effective temperature range for pure $H_2$ to reduce tin oxides on a tin-based solder is above 350° C. Such high temperatures may either damage or cause reliability problems to the packed electronic components. Therefore, a catalytic method to assist generating highly reactive $H_2$ radicals, and thus reducing the effective ranges of hydrogen concentration and processing temperature for reducing surface oxides, has been sought by the industry.

Fluxless (dry) soldering has been performed in the prior art using several techniques. One technique is to employ lasers to ablate or heat metal oxides to their vaporization temperatures. Such processes are typically performed under inert or reducing atmospheres to prevent re-oxidation by the released contaminants. However, the melting or boiling points of the oxide and base metal can be similar and it may not be desirable to melt or vaporize the base metal. Therefore, such laser processes are difficult to implement. Lasers are typically expensive and inefficient to operate and require a direct line of sight to the oxide layer. These factors limit the usefulness of laser techniques for most soldering applications.

Surface oxides can be chemically reduced (e.g., to $H_2O$) through exposure to reactive gases (e.g., $H_2$) at elevated temperatures. A mixture containing 5% or greater reducing gas in an inert carrier (e.g., $N_2$) is typically used. The reaction products (e.g., $H_2O$) are then released from the surface by desorption at the elevated temperature and carried away in the gas flow field. Typical process temperatures exceed 350° C. However, this process can be slow and ineffective, even at elevated temperatures.

The speed and effectiveness of the reduction process can be increased using more active reducing species. Such active species can be produced using conventional plasma techniques.

Gas plasmas at audio, radio, or microwave frequencies can be used to produce reactive radicals for surface de-oxidation. In such processes, high intensity electromagnetic radiation is used to ionize and dissociate $H_2$, $O_2$, $SF_6$, or other species, including fluorine-containing compounds, into highly reactive radicals. Surface treatment can be performed at temperatures below 300° C. However, in order to obtain optimum conditions for plasma formation, such processes are typically performed under vacuum conditions. Vacuum operations require expensive equipment and must be performed as a slow, batch process rather than a faster, continuous process. Also, plasmas are typically dispersed diffusely within the process chamber and are difficult to direct at a specific area. Therefore, the reactive species cannot be efficiently utilized in the process. Plasmas can also cause damage to process chambers through a sputtering process, and can produce an accumulation of space charge on dielectric surfaces, leading to possible micro-circuit damage. Microwaves themselves can also cause micro-circuit damage, and substrate or component temperature may be difficult to control during treatment. Plasmas can also release potentially dangerous ultraviolet light. Such processes also require expensive electrical equipment and consume considerable power, thereby reducing their overall cost effectiveness.

U.S. Pat. No. 5,409,543 discloses a process for producing a reactive hydrogen species (i.e., atomic hydrogen) using a hot filament to thermally dissociate molecular hydrogen in a vacuum condition. The energized hydrogen chemically reduces the substrate surface. The temperature of the hot filament may range from 500° C. to 2200° C. Electrically biased grids are used to deflect or capture excess free electrons emitted from the hot filament. The reactive species or atomic hydrogen are produced from mixtures containing 2% to 100% hydrogen in an inert carrier gas.

U.S. Pat. No. 6,203,637 discloses a process for activating hydrogen using the discharge from a thermionic cathode. Electrons emitted from the thermionic cathode create a gas phase discharge which generates active species. The emission process is performed in a separate or remote chamber containing a heated filament. Ions and activated neutrals flow into the treatment chamber to chemically reduce the oxidized metal surface. However, such hot cathode processes require vacuum conditions for optimum effectiveness and filament life. Vacuum operations require expensive equipment, which must be incorporated into soldering conveyor belt systems, thereby reducing their overall cost effectiveness.

Potier, et al., "Fluxless Soldering Under Activated Atmosphere at Ambient Pressure", Surface Mount International Conference, 1995, San Jose, Calif., and U.S. Pat. Nos. 6,146,503, 6,089,445, 6,021,940, 6,007,637, 5,941,448, 5,858,312 and 5,722,581 describe processes for producing activated $H_2$ (or other reducing gases, such as $CH_4$ or $NH_3$) using electrical discharge. The reducing gas is generally present at "percent levels" in an inert carrier gas ($N_2$). The discharge is produced using an alternating voltage source of "several kilovolts". Electrons emitted from electrodes in a remote chamber produce exited or unstable species that are substantially free of electrically charged species which are then flowed to the substrate. The resulting processes reduce oxides on the base metal to be soldered at temperatures near 150° C. However, such remote discharge chambers require significant equipment costs and are not easily retrofitted to existing soldering conveyor belt systems. In addition, these processes are typically employed for pre-treating the metal surface before soldering rather than removing solder oxides.

U.S. Pat. No. 5,433,820 describes a surface treatment process using electrical discharge or plasma at atmospheric pressure from a high voltage (1 kV to 50 kV) electrode. The electrode is placed in the proximity of the substrate rather than in a remote chamber. The free electrons emitted from the electrodes produce reactive hydrogen radicals—a plasma containing atomic hydrogen—which then pass through openings in a dielectric shield placed over the oxidized substrate. The dielectric shield concentrates the active hydrogen onto those specific surface locations requiring de-oxidation. However, such dielectric shields can accumulate surface charge that may alter the electric field and inhibit precise process control. The described process is only used to flux base metal surfaces.

Accordingly, there is a problem in the art in providing an economical and efficient process for removing metal oxides from at least one component and/or solder surface under relatively low temperatures to avoid damage to the electronic components. There is a problem in the art in providing a process and apparatus for fluxless soldering under near ambient or atmospheric pressure conditions that avoids the expense of purchasing and maintaining vacuum equipment such as required, for example, in a plasma-based process and apparatus. There is problem in providing a fluxless soldering process and apparatus for internal or non-exposed surfaces of a substrate. Additionally, there is an additional problem in the art for providing a fluxless soldering process that does not involve one or more flammable gases.

BRIEF SUMMARY OF THE INVENTION

The present invention solves some, if not all, of the problems of the art by providing a method and apparatus for removing metal oxides from at least one component and/or solder surface without requiring a flux, expensive vacuum equipment, and/or a flammable gas environment. In one aspect, there is provided an apparatus for removing metal oxides from the surface of a component comprising at least one selected from solder, metal, and combinations thereof through the emission of electrons in an ambient or non-vacuum pressure atmosphere by electron attachment comprising: a field emission apparatus comprising: a cathode having one or more protrusions and comprised of a conductive material wherein the material has a work function ranging from 2 to 5 eV; a dielectric material which surrounds at least a portion of the cathode; and an anode comprised of a conductive material which surrounds at least a portion of the dielectric material, wherein the cathode and anode are each connected to an electrical voltage source, and wherein the dielectric material between the cathode and anode is polarized wherein the dielectric material confines the electric field distribution and enhances the strength of the electric field near the one or more of the protrusions of the cathode and thereby emit electrons from the cathode. In this or other embodiments, at least a portion of the electrons are generated by one or more of the following processes: field emission, thermal-field emission, corona discharge, or combinations thereof.

In yet another aspect, there is provided an apparatus for removing metal oxides on at least one surface of a component comprising solder and metal oxides thereupon, the apparatus comprising: an field emission apparatus comprising: a cathode having one or more protrusions having a high curvature surface and comprised of a conductive material wherein the material has a work function ranging from 2 to 5 eV; a dielectric material which surrounds at least a portion of the cathode; and an anode comprised of a conductive material which surrounds at least a portion of the dielectric material wherein the cathode and anode are each connected to an electrical voltage source, and wherein the dielectric material between the cathode and anode is polarized, and provides an electric field at one or more of the protrusions of the cathode and thereby generate electrons from the cathode; a reducing gas wherein the electrons attach to at least a portion of the reducing gas to form anions; an insulating plate comprised of a plurality of openings wherein the component is set thereupon and is proximal to the field emission apparatus; and a conductive surface which is in contact with the bottom surface of the insulating plate and preferentially has an electric potential slightly more positive than that of the anode (e.g. 10V to 1 KV higher in voltage) to attract the anions towards the insulating plate and wherein the anions remove the metal oxides on the surface and then pass through the openings of the insulating plate towards the conductive surface.

These and other aspects of the invention will become apparent from the following detailed description.

DETAILED DESCRIPTION OF THE INVENTION

Figure 1:
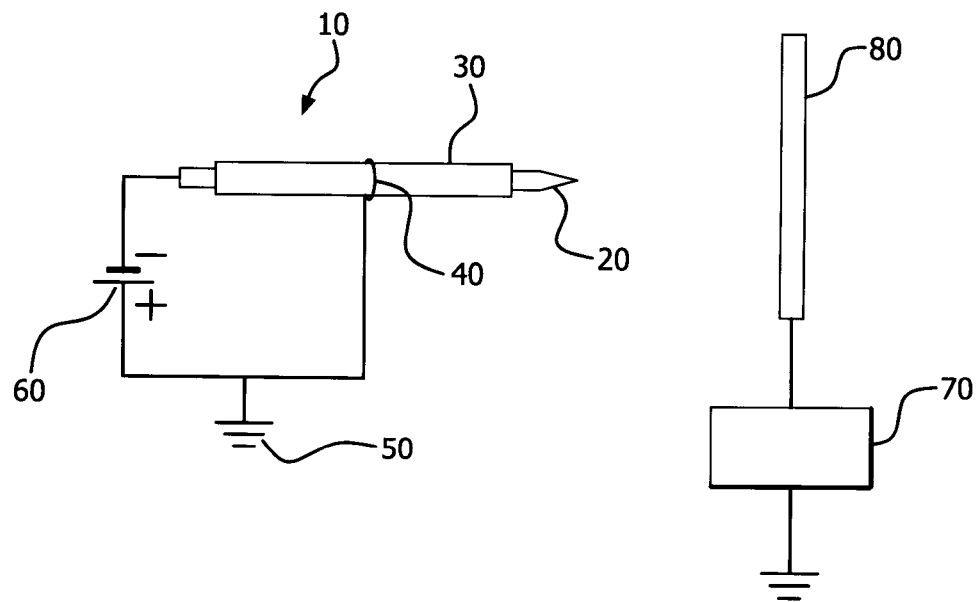
FIG. 1 provides an example of an embodiment of the field emission apparatus described herein and a test arrangement.

Method and apparatus for the removal of metal oxides from at least one surface of a component comprising at least one selected from solder, metal, and combinations thereof by exposure to negatively charged atomic ions of a reducing gas which is formed by an electron attachment process are disclosed herein. In certain embodiments, the exposure may occur before and/or during the reflow and soldering processes. The negatively charged atomic ions of the reducing gas reacts with and reduces the surface metal oxides on at least one surface of a component. The method and apparatus described herein can be employed by modifying traditional reflow and soldering equipments such as, for example, the reflow machines used for inner lead bonding and the reflow soldering or wave soldering machines used for outer lead bonding. The method and apparatus described herein can also be applied to other processes wherein the removal of the surface metal oxide is desired such as, but not limited to, metal plating (i.e., the solder plating of portions of printed circuit boards or metal surfaces to make them more amenable to subsequent soldering), surface cleaning, brazing, welding, and removing surface oxides of metals, such as copper oxide, formed during silicon wafer processing. The removal of metal oxides using the method and apparatus of the present invention is equally applicable to the aforementioned processes or any other process desirous of removing oxides without the need for organic fluxes, expensive vacuum equipment such as in plasma based processes, and/or flammable gas environments.

In one embodiment, the field emission apparatus described herein comprises: a cathode made of an electrically conductive material with a low work function and comprising one or more protrusions having a high surface curvature, such as a sharp tip, needle, finger, or the like wherein the cathode is surrounded by a dielectric material; a dielectric material wherein the dielectric material surrounds at least a portion of the cathode; and an anode wherein the anode surrounds at least a portion of the dielectric material, and wherein the cathode and anode are each connected to an electrical voltage source and the dielectric material between the cathode and anode is polarized which promotes the emission of electrons from the cathode. The disclosed field emission apparatus can also be used in other applications involving the need of forming free electrons in an ambient or non-vacuum atmospheric condition, such as, but not limited to, gas purification by electron attachment to remove dust or impurity particles, electrostatic painting, or coating. The term "ambient atmospheric condition" as used herein means an atmosphere having a pressure range having one or more following endpoints:

14.0, 14.5, 14.7, 15.0, 15.5, 16.0, 16.5, 17.0, 17.5, 18.0, 18.5, 19.0, 19.5, or 20.0 psig. In one particular embodiment, the ambient atmospheric condition ranges from 14 psig to 20 psig. In an alternative embodiment, the atmosphere of the furnace is pressurized.

The field emission apparatus disclosed herein may be particularly suitable for certain embodiments, such as for example, fluxless soldering of surface mount components including BGA, flip chip, and die attachment assemblies. In these embodiments, the soldering surface is not fully or evenly exposed to the cathode emitter and cannot act as an anode. The field emission apparatus disclosed herein comprises a cathode and anode which can deliver electrons and generate negatively charged atomic ions such as hydrogen anions through an electron attachment process.

The term "component" as used herein generally relates to a component comprised of a material such as silicon, silicon coated with silicon dioxide, aluminum-aluminum oxide, gallium arsenide, ceramic, quartz, copper, glass, epoxy, or any material suitable for use within an electronic device. In certain embodiments, the component has solder disposed upon at least one of its surfaces. Exemplary solder compositions include, but are not limited to, a fluxless tin-silver, a fluxless tin-silver-copper, a fluxless tin-lead, or a fluxless tin-copper. However, the method of the present invention is suitable for a variety of different components and/or solder compositions.

In certain preferred embodiments, the component in which the oxide is to be removed and/or soldered is positioned on a grounded or a positively biased substrate and is disposed within close proximity to the field emission apparatus. The component, the substrate, and the field emission apparatus are all in the same heating chamber which is purged with a gas mixture comprising a reducing gas and optionally a carrier gas. While not wishing to be bound by theory, it is believed that when an energy source such as direct current (DC) voltage is applied to at least one of two electrodes (e.g., cathode, anode, or combination thereof) contained within a field emission apparatus thereby creating an electrical potential, electrons are generated from the negatively biased electrode and drift toward the grounded or positively biased substrate with the component to be soldered. The electrons are generated mainly from the solid phase of the cathode material. However, in certain embodiments, an additional portion of the electrons may be generated from the gas phase when the applied voltage level is relatively high (e.g., greater than 5 eV). Some of the electrons generated from the field emission apparatus may collide with reducing gas molecules, thus dissociating the gas molecules and forming negatively charged atomic ions of the reducing gas by electron attachment. The negatively charged atomic ions of the reducing gas can drift along the electrical field toward the substrate with the component to be soldered, which thereby reduces the existing metal oxides on the base metal and/or solder without the need for traditional fluxes.

In one embodiment of the apparatus described herein, the apparatus comprises a device or a structure that contains a pair of electrodes, cathode and anode. This device can efficiently emit electrons out of the device at ambient pressure. If the device is in a reducing gas environment comprising $H_2$ and $N_2$, the emitted electrons can be attached on $H_2$ gas molecules, forming negatively charged atomic hydrogen ions or hydrogen anions by electron attachment (see Equations 1 and 2). The hydrogen anions can attach to the soldering surface to reduce surface oxides at relatively low temperatures (see Equation 3 below). The free electrons injected on the treating surface or generated as a byproduct of the oxide reduction can be discharged in various ways.

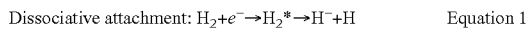
Dissociative attachment: $H_2 + e^- \rightarrow H_2^* \rightarrow H^- + H$  Equation 1

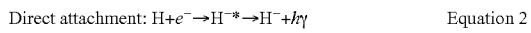
Direct attachment: $H + e^- \rightarrow H^{-*} \rightarrow H^- + h\gamma$  Equation 2

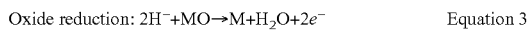
Oxide reduction: $2H^- + MO \rightarrow M + H_2O + 2e^-$  Equation 3

Energy is supplied to at least one of the electrodes, e.g., the cathode, the anode, or combinations thereof, sufficient to cause electron generation from the cathode. In certain embodiments, the energy source can be an electric energy source, such as a direct current (DC) voltage source. Other energy sources, such as, but not limited to, thermal energy, electromagnetic energy, or photo energy sources may also be used alone or in combination. The DC voltage source may be constant or, alternatively, pulsed. In certain embodiments of the present invention, the cathode is connected to a voltage source at a first voltage level and the anode is connected to a voltage source at a second level. The difference in the voltage levels creates a bias in electrical potential. One of the first or second voltage levels may be zero indicating that either the cathode or the anode is grounded.

Not wishing to be bound by a theory, a proposed mechanism for the field emission of electrons can be explained as follows. When the cathode and anode of the field emission apparatus are properly connected to one or more electrical voltage source, the dielectric material (e.g., insulating material such as a ceramic tube) which surrounds at least a portion of the cathode is polarized, which can confine electric field distribution and thus intensify the field strength near the apex of the high curvature surface of the at least one protrusion, such as a sharp needle tip, finger, or the like. Since the polarization is proportional to the dielectric constant of the dielectric material, a dielectric material with a relatively high dielectric constant, e.g., 1000 or greater is particularly preferred, such as barium titanate and other piezoelectric ceramics, such as PZT (Lead Zirconate Titanate). The voltage potentials applied on the two electrodes for initiating electron emission depends on the geometry, material, and arrangement of the field emitter structure. The field emitter described herein may be particularly useful for embodiments which involve activating $H_2$ gas and reducing metal oxides on non-exposed, or non-flat, or insulated substrates with metal traces, such as for electronic assembling of flip chips, die attachment devices, 3D stacked chips, surface mount components, and through hole components. In these embodiments, the treating surface is no longer suitable to act as an anode.

When the field emission apparatus is used for removing metal oxides on metal traces of an electrically insulated substrate, various discharging approaches can be applied to remove charges accumulated on the substrate. For example, various commercial available charge neutralizers can be used in conjunction with apparatus and method described herein. As an alternative example, a charge receiver device containing sharp tips, needles, or fingers powered with high positive voltage potential can also be used in conjunction with current design to remove accumulated charges.

In certain embodiments, the apparatus described herein is used to reduce the metal oxides on a surface that is not exposed to the cathode electron emitter, such as, for example, non-exposed or interior surfaces, such as for reflow soldering of flip chips, 3D stacked chips, and die attachment devices. In these embodiments, several approaches can be used to direct the negatively charged atomic ions of a reducing gas to the soldering surfaces. In one embodiment, the cathode in the field emission apparatus, such as the sharp tips, needles, fingers or the like, can be directly faced toward the gap between two soldering surfaces of a component and the component can be directly grounded or set on a grounded surface for drain charges. In an alternative embodiment, electron emission can be applied above the components to be assembled and the components can be set on a perforated insulating plate, which is then placed upon a conductive plate, such as a conductive metal plate. The perforated insulating plate allows the negatively charged atomic ions or anions to spread all over the insulating surface, thus allowing the anions to reach the non-exposed soldering surfaces of the components to reduce the metal oxides. The perforated insulating plate also allows the negatively charged atomic ions to discharge through the openings to the conductive plate set underneath. It is preferred that the conductive plate placed underneath the perforated insulating plate has an electrical potential slightly more positive than that of the anode of the field emission apparatus (e.g. 10V to 1 KV higher in voltage) to assist the drift of or attract at least a portion of the negatively charged atomic ions, anions, and/or electrons to the soldering surface of the component. As an example in this or other embodiments, the perforated insulating plate can be a perforated ceramic plate of 0.5 to 2 millimeters (mm) thick with holes of 0.1 to 0.6 mm in diameter and 1 to 5 mm in distance. However, it is anticipated that other geometries may be suitable depending on the geometries of the components to be soldered. As an alternative example in soldering a die attachment device wherein the size of the die is significantly smaller than that of the substrate to be soldered, the perforated insulating plate can be a porous insulating plate with pore size ranging from 10 nanometer (nm) to 100 micron meter (μm) to achieve an equivalent result on spreading negatively charged reducing gas to the non-exposed soldering surfaces.

As mentioned above, it is preferred that the conductive plate underneath the perforated insulating plate has an electrical potential slightly more positive than that of the anode of the field emission apparatus. A simple approach to obtain this is to electrically ground the conductive plate and use a resistor or varistor to connect the grounded plate and the anode of the field emission apparatus. The net potential difference between the grounded plate and the anode will be increased by increasing the resistance value applied between the two. However, it is anticipated that other means, besides a varistor, can be used to make the conductive plate slightly more positive in electrical potential than that of the anode of the field emission apparatus to direct the flow of negatively charged atomic ions, anions and/or electrons within the reducing gas to the treating surface of the substrate.

To produce negatively charged atomic ions by electron attachment using a field emission apparatus, a large quantity of electrons needs to be generated from the cathode surface. In this connection, the electrons can be generated by pure field emission or thermal field emission. Among these electron generation methods, the selection of the method depends mainly on the efficiency and the energy level of the electrons generated. For embodiments wherein the reducing gas comprises hydrogen, electrons having an energy level close to 4 eV may be preferred.

In this or other embodiments, at least a portion of the electrons are generated by one or more of the following processes: field emission, thermal-field emission, or combinations thereof. In this or other embodiments, a portion of electrons may be generated via corona discharge near the high curvature surface of the at least one protrusion of the cathode when the electric voltage level between the cathode and anode is relatively high (e.g. higher than 5 KV for 1 cm distance between two electrodes). Field emission is the extraction of electrons from a solid via tunneling through a surface potential barrier by applying a strong electric field. Typically, an electric field as high as $10^6$ to $10^7$ V/cm is required to extract electrons. Such a high electric field is normally created at the apex of a sharp tip of the cathode. In certain embodiments, the field emitter described herein applies a special arrangement of the two electrodes (e.g. cathode is surrounded by a dielectric material and the dielectric material is surrounded by an anode). The polarization property of the dielectric material intensifies electric field near the apex of the cathode protrusion (e.g., sharp tip, needle, or finger), thus reducing the onset voltage for electron emission. In certain preferred embodiments described herein, a constant or pulsed DC voltage is applied between a cathode with a high surface curvature and an anode at a voltage ranging from 0.5 to 5 KV.

For certain embodiments, thermal energy is used to assist field emission, which is so called thermal-field emission. In thermal-field emission, both an electric field and a high temperature are applied. Therefore, thermal-field emission requires a lesser electric field for generating the same quantity of electrons as compared with pure field emission. In certain preferred embodiments, the temperature of the cathode may range from 150° C. to 1000° C. In these embodiments, the electric field can range from 0.1 to 3 KV. The cathode may be brought to and/or maintained at a high temperature by a variety of methods such as, but not limited to, direct heating by passing an energy source such as A$^c$ or DC current through the cathode, indirect heating such as contact the cathode surface with en electrically insulated hot surface heated by heating element, IR radiation, induction heating, hot gas environment, or a combination thereof.

In certain embodiments of the apparatus described herein, besides the majority of electrons generated by field emission from the cathode of the field emitter, a portion of electrons are generated via corona discharge near the high curvature surface of the at least one protrusion of the cathode. The corona discharge is preferably minimized in order to increase the efficiency of forming negatively charged hydrogen ions by electron attachment and increase the lifetime of the cathode tip. More specifically, when the applied voltage between the two electrodes is above a certain level that a corona discharge is formed, gas molecules are ionized into positively charged ions and negatively charged electrons, which can attract each other and quickly recover back to the original atoms and molecules, especially in ambient pressure where the density of gas molecules is much higher than that in vacuum. In addition, the positively charged ions in corona will drift along the electrical field to the cathode tip, which not only has no positive impact to oxide reduction on the treating surface but also can reduce the lifetime of the cathode tip by ion bombardment. In contrast, the gas phase in electron attachment process is singly charged and the negatively charged ions can repel each other thus having a relatively long lifetime even in ambient pressure. The negatively charge ions formed in electron attachment process can be directed away from the cathode and towards the treating surface, thus minimizing tip's damage and promoting oxide reduction at the treating surface. In certain preferred embodiments of the cathode emission mechanisms described above, the voltage applied across the two electrodes may be constant or pulsed. The frequency of the voltage pulse ranges from 0 to 100 kHz and preferably from 0 to 20 KHz. In these embodiments, it is believed that a pulsed voltage may be preferable to a constant voltage to reduce the tendency of gas phase breakdown or arcing, especially when the applied voltage is relatively high.

More specifically, an embodiment of the field emission apparatus 10 described herein is shown in FIG. 1. A needle with a sharp tip is acting as a cathode 20, which is inserted in an electrically insulated tube 30, such as an alumina tube which acts as the dielectric material. A metal wire 40 is wound around the tube which acts as the anode. Cathode needle 20 and anode wire 40 are in electrical communication with an electrical voltage source 60 and a ground source 50. When the cathode needle and anode metal wires are properly connected to pulsed or constant DC voltage source 60 and a ground source 50, electrons can be emitted from the sharp needle tip 20. If an electrically grounded metal piece 80 is located in front of the field emission apparatus 10 and is connected with a current meter in series 70, the current meter indicates that the metal piece 80 received negative charges. When the anode wire 40 is electrically floated or disconnected with the corresponding voltage source 60, however, the electron emission from the tip of needle 20 will disappear even when the negative voltage potential applied on the cathode is significantly increased.

Figure 2:
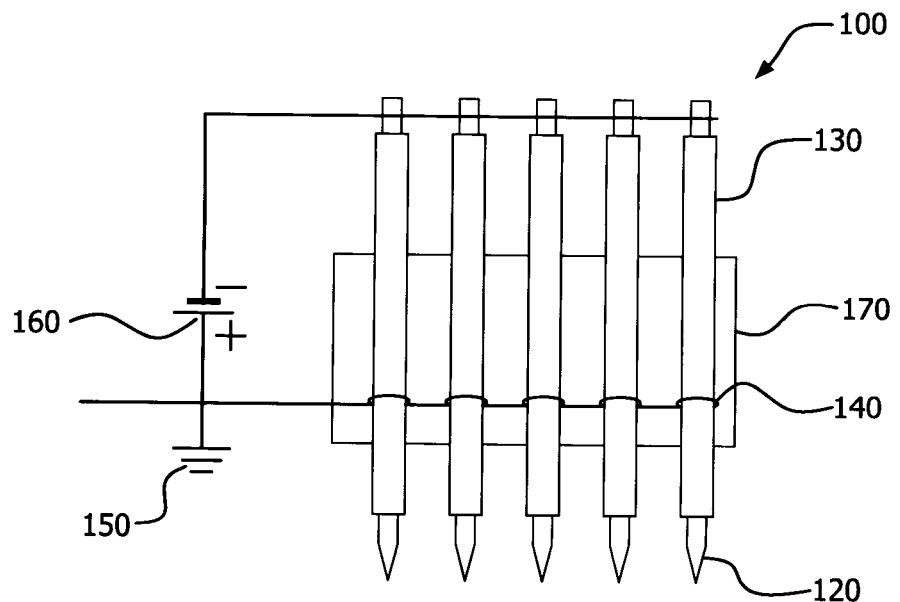
FIG. 2 provides an example of an embodiment of the field emission apparatus described herein wherein the field emitter comprises a cathode comprised of a plurality of needles.

FIG. 2 provides an additional example of a field emission apparatus 100 having an array of cathode needles 120. Each cathode needle 120 is individually surrounded by alumina tubes 130 which are further surrounded by anode wires 140. Cathode needles 120 and anode wires 140 are in electrical communication with an electrical voltage source 160 and a ground source 150. The embodiment in FIG. 2 further comprises an insulating plate such as ceramic plate 170 which supports the cathode needle 120, alumina tube 130, and anode wire 140 assembly.

Figure 3:
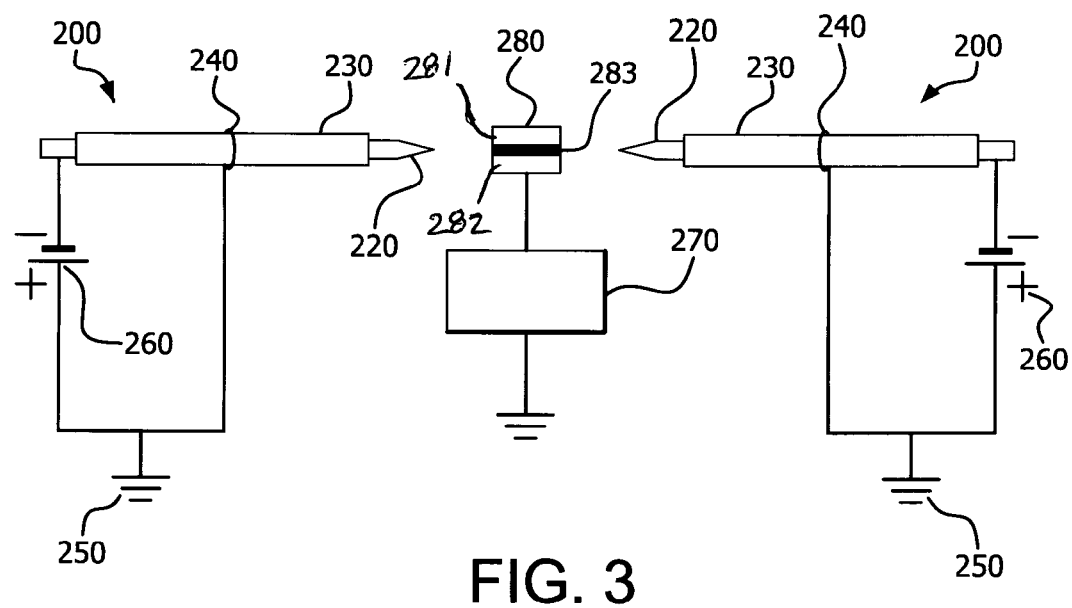
FIG. 3 provides an additional example of an embodiment of the field emission apparatus described and a test arrangement to observe the reduction of metal oxides on a sample.

FIG. 3 provides an example of an arrangement wherein two field emission apparatuses 200 described herein are used. Each field emission apparatus 200 has a cathode needle 220 which at least a portion of needle 220 surrounded by a dielectric material such as alumina tube 230. Dielectric material 230 is further surrounded by an anode such as anode wire 240 depicted. Both cathode needles 220 and anode wires 240 are in electrical communication with an electrical voltage source 260 and a ground source 250. FIG. 3 further includes a die attachment sample 280 which contains a fluxless gold/tin solder preform (m.p. 280° C.) 283 sandwiched by a gold/nickel coated ceramic 281 and a gold/nickel coated copper layer 282. A current meter 270 is positioned in between both field emission apparatus 200 and is further described in Examples 2, 3, and 4 herein.

Figure 4:
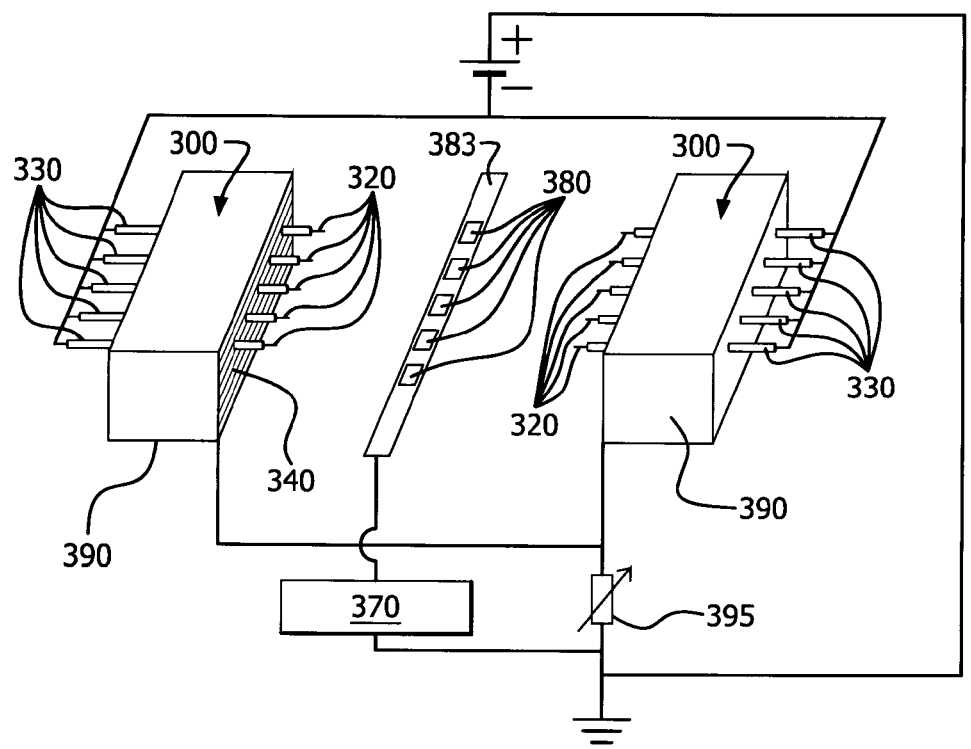
FIG. 4 provides an additional example of an embodiment of the field emission apparatus described herein.

FIG. 4 provides yet another example of an arrangement wherein two field emission apparatuses 300 described herein are used. Each field emission apparatus 300 has a plurality of cathode needles 320 which at least a portion of needles 320 are surrounded by a dielectric material such as alumina tubes 330. The cathode needles 320 and alumina tubes 330 are encased within ceramic block 390. Dielectric materials 330 is further surrounded by an anode such as silver anode 340 (which is a silver foil surface placed upon ceramic block 390) depicted. Both cathode needles 320 and silver anode 340 are in electrical communication with an electrical voltage source 360, varistor 395, and a ground source 350. FIG. 4 further depicts a die attachment sample 380 which is supported upon a copper base 383 and current meter 370 which is positioned in between both field emission apparatus 300 and is used in Example 5 described herein.

Figure 5:
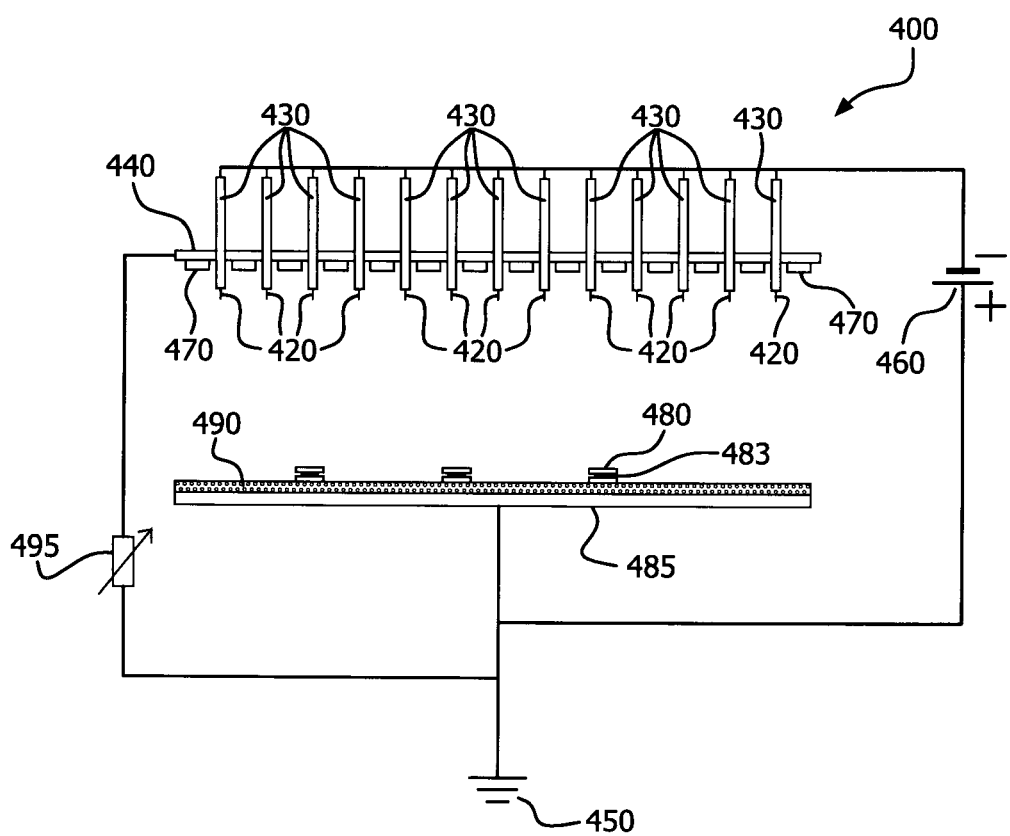
FIG. 5 provides an example of an embodiment of the apparatus described herein for treating non-exposed and non-grounded soldering surfaces.

FIG. 5 provides a further example of an arrangement wherein a field emission apparatus 400 described herein is used for treating non exposed, non-flat, or electrically non-conductive surfaces 483 of die attachment component 480. Field emission apparatus 400 has a plurality of cathode needles 420 which at least a portion of needles 420 are surrounded by a dielectric material such as alumina tubes 430. The cathode needles 420 and alumina tubes 430 are inserted through an anode such as silver anode 440 (which is a silver plate) which surrounds at least a portion of the dielectric material 430 as depicted. A least a portion of anode 440 is covered by an insulating shield such as ceramic shield 470 shown. Both cathode needles 420 and silver anode 440 are in electrical communication with an electrical voltage source 460, varistor 495, and a ground source 450. Die attachment samples having internal or non-exposed surfaces 483 which are supported upon an insulating plate having a plurality of openings such as the perforated ceramic plate 490 shown which is further supported upon a conductive surface such as metal plate 485 shown.

As mentioned previously, for cathode emission, the electrons are emitted from an electrode that may act as a cathode. In certain embodiments, the electrode material that acts as a cathode is comprised of a conductive material with relatively low electron-emission energy or work function. The term "work function" as used herein is the minimum energy measured in electron volts (eV) needed to remove an electron from a solid such as the electrically conductive material of the cathode to a point immediately outside the solid surface. In these embodiments, the cathode has a work function that ranges from 2 to 5 eV. The material preferably also has a high melting point and relatively high chemical stability under processing conditions. Examples of suitable materials include metals, alloys, semiconductors, and oxides coated or deposited onto conductive substrates. Further examples include, but are not limited to, tungsten, graphite, and high temperature alloys such as nickel chromium alloy. Additional examples of cathode materials or coatings on a base metal are refractory ceramic materials, such as lanthanum hexaboride ($LaB_6$) and cerium hexaboride ($CeB_6$), and refractory metal carbides and nitrides, such as ZrC, HfC, and TaN.

As mentioned previously, at least a portion of the cathode of the field emitter is surrounded by or directly contacted with an electrically insulative material or dielectric material and wherein at least a portion of the insulative or dielectric material is surrounded and/or directly contacted with an electrically conductive anode. In one embodiment, the dielectric material comprises a insulative ceramic material, which can sustain high temperature and is chemically stable in the normal process condition. In other embodiments, it is preferred that the dielectric material has a high dielectric constant (e.g. 1000 to 10,000), such as barium titanate. Additional examples of the high dielectric materials are piezoelectric ceramics, such as various lead zirconate titanate (PZT) ceramics.

As previously mentioned, at least a portion of the dielectric material is surrounded and/or directly contacted with an electrically conductive anode. The electrically conductive anode is preferably a metal or any of the other materials that is electrically conductive in nature. The anode can have a variety of different geometries depending upon the application to intensify polarization effect on the dielectric material and to maximize electric field intensity near the high curvature surface of the cathode. The anode can be grounded or connected to a voltage level with a positive bias relative to the cathode. In one particular embodiment, the anode is a conductive metal wire which is wound around a dielectric material which encapsulates the cathode. In other embodiments, the anode is a plate or shield that the cathode and dielectric material protrudes through.

As mentioned previously, a gas mixture comprising a reducing gas is introduced into the atmosphere wherein the field emission apparatus described herein resides. The reducing gas contained within the gas mixture may fall within one or more of the following categories: 1) an intrinsically reductant gas, 2) a gas capable of generating active fragments which form gaseous oxides upon reaction of the active species with the metal oxide, or 3) a gas capable of generating active fragments which form liquid or aqueous oxides upon reaction of the active species with the metal oxide.

The first category of gases, or an intrinsically reductant gas, includes any gas that thermodynamically acts as a reductant to the oxides to be removed. Examples of intrinsically reductant gases include $H_2$, CO, $SiH_4$, $Si_2H_6$, formic acid, alcohols such as, for example, methanol, ethanol, etc., and some acidic vapors having the following formula (III):

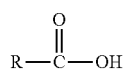
(III)

In formula (III), substituent R may be an alkyl group, substituted alkyl group, an aryl, or substituted aryl group. The term "alkyl" as used herein includes straight chain, branched, or cyclic alkyl groups, preferably containing from 1 to 20 carbon atoms, or more preferably from 1 to 10 carbon atoms. This applies also to alkyl moieties contained in other groups such as haloalkyl, alkaryl, or aralkyl. The term "substituted alkyl" applies to alkyl moieties that have substituents that include heteroatoms such as O, N, S, or halogen atoms; $OCH_3$; OR(R=alkyl $C_{1-10}$ or aryl $C_{6-10}$); alkyl $C_{1-10}$ or aryl $C_{6-10}$; $NO_2$; $SO_3R$ (R=alkyl $C_{1-10}$ or aryl $C_{6-10}$); or $NR_2$ (R=H, alkyl $C_{1-10}$ or aryl $C_{6-10}$). The term "halogen" as used herein includes fluorine, chlorine, bromine, and iodine. The term "aryl" as used herein includes six to twelve member carbon rings having aromatic character. The term "substituted aryl" as used herein includes aryl rings having substitutents that include heteroatoms such as O, N, S, or halogen atoms; $OCH_3$; OR(R=alkyl $C_{1-10}$ or aryl $C_{6-10}$); alkyl $C_{1-10}$ or aryl $C_{6-10}$; $NO_2$; $SO_3R$(R=alkyl $C_{1-10}$ or aryl $C_{6-10}$); or $NR_2$ (R=H, alkyl $C_{1-10}$ or aryl $C_{6-10}$). In certain preferred embodiments, the gas mixture contains hydrogen.

The second category of reducing gas includes any gas that is not an intrinsically reductive but can generate active species, such as, for example, H, C, S, H', C', and S', by dissociative attachment of electron on the gas molecules and form gaseous oxides by reaction of the active species with the metal oxides to be removed. Examples of this type of gas include: $NH_3$, $H_2S$, $C_1$ to $C_{10}$ hydrocarbons such as but not limited to $CH_4$, $C_2H_4$, acidic vapors having the formula (III), and organic vapors having the following formula (IV):

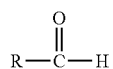
(IV)

In formulas (III) and (IV), substituent R may be an alkyl group, substituted alkyl group, an aryl, or substituted aryl group.

The third category of gas includes any gas that is not an intrinsically reductive but can form active species, such as, for example, F, Cl, F', and Cl', by dissociative attachment of electron on the gas molecules and form liquid or aqueous oxides by reaction of the active species with the metal oxides. Examples of this type of gas include fluorine and chlorine containing gases, such as $CF_4$, $SF_6$, $CF_2Cl_2$, HCl, $BF_3$, $WF_6$, $UF_6$, $SiF_3$, $NF_3$, $CClF_3$, and HF.

Besides including one or more of the above categories of reducing gases, the gas mixture may further contain one or more carrier gases. The carrier gas may be used, for example, to dilute the reducing gas or diluting the reactive gas or provide collision stabilization. The carrier gas used in the gas mixture may be any gas with an electron affinity less than that of the reducing gas within the gas mixture. In certain preferred embodiments, the carrier gas is an inert gas. Examples of suitable inert gases include, but are not limited to, $N_2$, Ar, He, Ne, Kr, Xe, and Rn.

In certain preferred embodiments, the gas mixture comprises hydrogen as the reducing gas and nitrogen as the carrier gas due to its relatively lower cost and the environmental friendliness of the exhaust gas release. In these embodiments, the gas mixture comprises from 0.1 to 100% by volume, preferably 1 to 50% by volume, or more preferably from 0.1 to 4% by volume of hydrogen. Amounts of hydrogen lower than 4% are preferred, which makes the gas mixture non-flammable.

As mentioned previously, the component or work piece in which the oxide is to be removed and/or soldered is preferably disposed within close proximity to the field emitter. The distance between the cathode emitter tip and the top surface of the component may range from 0.1 to 5 cm or from 0.5 to 1 cm. In certain embodiments, the field emitter and/or the component (or target assembly) may be moved. In this regard, the field emitter may be in a fixed position and the component may be moved, the field emitter may be moved and the component may be in a fixed position, or both the field emitter and the component are moved. The movement may be vertical, horizontal, rotational, or along an arc.

The method disclosed herein can be used in several areas besides soldering in electronic assembly such as, for example, surface cleaning, metal plating, brazing, welding, and reflow of a solder bumped wafer. In one particular embodiment, the method can be used to reduce surface oxides of metals, such as copper oxide, formed during silicon wafer processing. Such oxides may form as a result of the various wet processing steps, such as chemical mechanical planarization, that are used to form micro-electronic devices on the wafers. These surface oxides reduce device yield and device reliability. The method allows surface oxides to be removed in a fully dry, environmentally friendly manner that does not require the use of aqueous reducing agents. Further, since the method can be performed at relatively low temperatures, it does not significantly affect the thermal budget of the device during processing. Higher temperatures, by contrast, tend to reduce device yield and reliability by causing diffusion of dopants and oxides thereby reducing device performance. Since the method can also be performed on a single wafer, the method can be integrated with other single wafer processes, thereby providing better compatibility with other fabrication steps.

The field emission apparatus disclosed herein can also be used for generating free electrons for electron attachment in ambient or non-vacuum condition for gas purification and electrostatic painting. For gas purification, the generated electrons from the cathode can be attached to at least a portion of particles in the gas to be purified since most of particles have a positive electron affinity. The negatively charged particles by electron attachment can drift along the electrical field to the anode, thus making gas phase purified. For embodiments involving electrostatic painting, the free electrons emitted from a cathode can be attached to at least a portion of the painting material and the negatively charged painting material can be directed to the surface to be painted which is either directly grounded or attached to a grounded metal surface.

The invention will be illustrated in more detail with reference to the following examples, but it should be understood that the present invention is not deemed to be limited thereto.

Example 1

A field emission apparatus, such as that shown in FIG. 2 and containing five stainless steel cathode needles each tightly inserted into a dielectric material which comprised an alumina ceramic tube (0.46 mm inner diameter (I.D.) and 1.2 mm outer diameter (O.D.)) which was then mounted on a ceramic plate, was used in the present example. The distance between the cathode needles was 5 mm. The sharp tip of each cathode needle protruded about 1.0 mm out of the corresponding alumina ceramic tube. An anode metal wire was wound on each of the five tubes and electrically grounded. The wound anode wire was 10 mm away from the end of the tube toward the sharp tip side of the cathode needle. Such prepared structure was located in a quartz tube furnace purged with 4 vol % $H_2$ in $N_2$ at room temperature. When a pulsed (10 KV) negative voltage potential applied on the five needles was increased to −3.7 KV, all the five needle tips started to emit electrons. When electron emission starts on a needle, the corresponding needle tip light up in a blue color in $H_2$ and $N_2$ gas mixture due to gas excitation around the tip during electron attachment process. When the anode wire was disconnected from the ground, the five tips of the cathode needles did not lit up even when the cathode voltage potential was increased to −4.3 KV. A further increasing in the negative voltage potential would cause arcing or gas phase discharge. When the voltage potentials were switched between the cathode and the anode, such as the needles being connected to the ground and the wire wound on each ceramic tube connected to a negative voltage potential, there was no lit tips even when the negative voltage potential was as high as −4.8 KV. This result demonstrates the basic concept of the field emission apparatus described herein. More specifically, electrons can be injected out of the field emission apparatus described herein.

Example 2

A field emission apparatus structure, which contains two stainless steel cathode needles each inserted with a ceramic (alumina) tube or dielectric material and mounted on both sides of a die attachment sample placed on a copper plate such as the configuration shown in FIG. 3 was tested. The die attachment sample was electrically conductive and grounded. The distance between each needle tip and the sample edge was 5.5 mm. The sharp tip of each cathode needle extended 1.0 mm out of the corresponding dielectric tube. An anode metal wire was wound upon each of the two dielectric materials or tubes and electrically grounded. The wound anode wire was 10 mm away from the end of the tube toward the sharp tip side. Such prepared structure was located in a quartz tube furnace purged with 4 vol % $H_2$ in $N_2$ at room temperature. When a pulsed (10 KV) negative voltage potential applied on the two needles was increased to −1.9 KV, the two needle tips lit up in a blue color, indicating electron emission. When the sample was grounded and connected to a current meter in series, it was found that the current received on the sample was −0.24 mA. When the negative voltage potential on the two needles was increased to −2.2 KV, the received current on the sample was 0.4 mA. This result demonstrates that the electrons emitted from the cathode tips can be received at the treating surface.

Example 3

The same field emission apparatus structure and the sample arrangement described in Example 2 and FIG. 3 was tested again in a quartz tube furnace purged with 15 vol % $H_2$ in $N_2$. The die attachment sample 280 contained a fluxless gold/tin solder preform (m.p. 280° C.) 283 sandwiched by a gold/nickel coated ceramic 281 and a gold/nickel coated copper 282, which were used to simulate die attachment device. The three pieces of the die attachment sample each had the same size: 3 mm×6 mm. To demonstrate the feasibility of electron attachment (EA) activated $H_2$ in $N_2$ for fluxless die attachment, a pulsed (10 KV) negative voltage potential was applied on the two needles at room temperature. When the applied voltage was increased to −1.8 KV, the two needle tips lit up in a blue color, indicating electron emission. The current received on the sample was −0.45 mA. The sample was then heated up to 290° C. in a ramp time of two minutes and soaked at 290° C. for one minute before cooling down. The electron attachment (EA) was maintained during the temperature ramping and soaking. It was found that when the sample temperature was increased to 290° C., a −1.8 mA current was received for the same applied voltage (−1.8 KV) on the cathode needles. After the heating cycle, the treated sample was taken out of the furnace and analyzed under optical microscope and scanning electron microscopy (SEM). The results of the analysis concluded that the solder wetting was good. This result demonstrates that increasing temperature and hydrogen concentration can both assist electron emission, such as having more emission current at a given applied voltage or a reduced onset voltage for starting emission compared with previous examples. It also demonstrates that fluxless soldering can be achieved by using the field emission apparatus described herein in a $H_2$ and $N_2$ gas mixture at a temperature only slightly above the solder's melting point.

Example 4

Comparative Example

Another die attachment sample with the same material configuration and size was treated in the same temperature heating cycle and gas environment described in Example 3 except that EA was not applied. It was found that solder wetting after the heating cycle was poor. More specifically, there were many solder de-wetted spots around the edge of the die attachment sample. This result shows that without applying EA, the gaseous $H_2$ cannot effectively reduce solder oxides at the same solder reflow temperature.

Example 5

FIG. 4 shows an additional example of the field emission apparatus, which contained two groups of stainless steel cathode needles mounted on both sides of a row of die attachment samples. Each group contained five cathode needles and each needle was inserted into the dielectric material such as the ceramic (alumina) tube. The sharp tip of each cathode needle extended 1.0 mm out of the corresponding ceramic tube. The distance between each of the two adjacent needles was 1.2 cm. The five cathode needles and the corresponding ceramic tubes in each group protruded through a silver foil surface, which acts as an anode. In other words, the anode surface was vertically positioned to the cathode needle length direction. The protruded length of each ceramic tube or dielectric tube from the anode surface was 2 mm. The silver anode was connected to a varistor and then connected to the ground. The electric resistance of the varistor was varied to adjust the electric potential of the silver anode. When a negative DC voltage was applied to the two groups of needles, all the needles lit up in a blue color in a $H_2$ and $N_2$ gas mixture, even when the die attachment samples were not electrically grounded (electrically floated). To attract more atomic hydrogen ions on the treating surface, five die attachment samples located at the center of the two group needles were electrically grounded with a current meter connected in series to monitor the received current. The distance between needle tips of each group and the edge of die attachment samples was 1.6 cm. The total current supply to the two group needles was monitored from the DC power source. Tables 1 and 2 provide the detailed data obtained from this testing arrangement. By increasing electrical resistance downstream of the silver anode, more current can be directed to the die attachment samples (Table1). Again, increasing temperature and hydrogen concentration can both assist electron emission, such as having more emission current at a given applied voltage or a reduced onset voltage for starting emission (Table 2). This example demonstrates that with an improved field emission apparatus structure, such as using an anode surface instead of using an anode wire wound around the dielectric tube, the required voltage for field emission can be largely reduced and even the voltage pulse to minimize arcing can be eliminated compared with previous examples.

TABLE 1

Effect of Increasing Resistance Downstream of Anode

| Temperature (° C.) | Gas (Vol. % of $H_2$ in $N_2$) | Resistance (Ω) | Voltage (KV) | Activated Tips (#) | Total Emission (mA) | Current at Samples (mA) |
|---|---|---|---|---|---|---|
| 25 | 4 | 0 | −1.35 | 10 | −4.94 | −1.70 |
| 25 | 4 | $1 \times 10^6$ | −1.59 | 10 | −4.47 | −2.99 |
| 25 | 4 | $2 \times 10^6$ | −1.59 | 10 | −4.19 | −3.32 |
| 25 | 4 | $3 \times 10^6$ | −1.59 | 10 | −4.06 | −3.70 |
| 25 | 4 | $4 \times 10^6$ | −1.59 | 10 | −4.06 | −3.76 |

TABLE 2

Effects of Temperature

| Temperature (° C.) | Gas (Vol. % of $H_2$ in $N_2$) | Resistance (Ω) | Voltage (KV) | Activated Tips (#) | Total Emission (mA) |
|---|---|---|---|---|---|
| 25 | 15 | 0 | −1.21 | 10 | −3.80 |
| 25 | 15 | $1 \times 10^5$ | −1.28 | 10 | −3.34 |
| 25 | 15 | $1 \times 10^6$ | −1.70 | 10 | −5.04 |
| 150 | 15 | $1 \times 10^5$ | −1.28 | 10 | −4.02 |
| 150 | 15 | $1 \times 10^6$ | −1.70 | 10 | −7.12 |

Example 6

FIG. 5 provides an embodiment of the field emission apparatus for treating non exposed soldering surfaces of die attachment components. The field emission apparatus contained a perforated anode plate made of stainless steel (440), a perforated 1.5 mm thick ceramic plate underneath the anode plate as a shield to the emitted electrons (470), and an array of cathode needles made of stainless steel (430), each cathode needle tightly inserted in an alumina tube 430 and each tube inserted in a hole of the two layers of the perforated plates (e.g., 440 and 470). The end of each alumina tube having a sharp needle tip protruded 4 mm out of the anode surface and each needle tip protruded 1 mm out of the alumina tube. In addition, the diameter of each hole on the perforated anode plate was the same as the outer diameter (O.D.) of each alumina tube, which was 1.2 mm; and the diameter of each hole on the perforated ceramic plate was 1.6 mm. The distance between each two needles of the cathode array was 9 mm. A varistor was applied between the perforated anode and the ground. Such structured field emitter apparatus was installed 1 cm above the components to be assembled. The components to be assembled were set on a perforated ceramic plate of 1 mm in thickness, which was set on a grounded metal plate. The hole diameter of the perforated ceramic plate was 0.4 mm and the distance between each of the two holes on the perforated ceramic plate was 2 mm. When the die attachment components containing eutectic tin-lead solder on the non exposed soldering surfaces (483) were heated to 225° C. in 15 volt % $H_2$ in $N_2$ under an electron attachment environment by applying a 10 KHz pulsed DC voltage of −2.4 KV (pulsing from 0 KV to −2.4 KV) to the cathode needles, a good solder reflow was achieved.

Example 7

Comparative Example

Example 6 was repeated except that the components to be assembled were directly set on a grounded plate (e.g., perforated ceramic plate 490 was removed). It was found that when the die attachment components containing eutectic tin-lead solder on non exposed soldering surfaces (483) were heated to 225° C. in 15 vol % $H_2$ in $N_2$ under electron attachment by applying 10 KHz pulsed DC voltage of −2.4 KV to the cathode needles, a good solder reflow could not be achieved. This example confirmed the need of the perforated ceramic plate set above the grounded plate (such as that demonstrated in example 6) for directing the flow of negatively charged atomic hydrogen ions to the non-exposed soldering surfaces.

Example 8

Comparative Example

The arrangement of example 6 was repeated except that the components to be assembled were set on a solid (e.g., not perforated) ceramic plate of the same thickness (1 mm), which was set atop a grounded metal plate. Again, the die attachment components containing eutectic tin-lead solder on the non exposed soldering surfaces were heated to 225° C. in 15 vol % $H_2$ in $N_2$. When a pulsed DC was applied on the cathode as in example 6, electron emission could not be obtained which was expected since there was no route for charge draining. As an alternative, the voltage applied on the cathode needles was pulsed between −2.5 KV to +2.5 KV at a frequency of 10 KHz, and a streamer-type corona discharge between each needle tip and the solid ceramic plate was formed. However, a good solder reflow could not be achieved under the corona discharge. This result demonstrate that corona discharge is inefficient for activating hydrogen for fluxless soldering.

While the invention has been described in detail and with reference to specific examples thereof, it will be apparent to one skilled in the art that various changes and modifications can be made therein without departing from the spirit and scope thereof.

The invention claimed is:

1. An apparatus for removing metal oxides on at least one surface of a component comprising solder and metal surfaces thereupon, the apparatus comprising:
an electron emission apparatus comprising:

a cathode having one or more protrusions having a high curvature surface and comprised of a conductive material wherein the material has a work function ranging from 2 to 5 eV;

a dielectric material which surrounds at least a portion of the cathode; and an anode comprised of a conductive material which surrounds at least a portion of the dielectric material, wherein the cathode and anode are each connected to an electrical voltage source, and wherein the dielectric material between the cathode and anode is polarized to provide an electric field at one or more of the protrusions of the cathode and thereby generate electrons from the cathode;

an insulating plate comprised of a plurality of openings wherein the component is set thereupon and is proximal to the field emission apparatus;

a conductive surface having an electrical potential which is from 10V to 1KV higher in voltage than the voltage of the anode of the electron emission apparatus wherein the insulating plate is placed thereupon and wherein the negatively charged atomic ions of the reducing gas are attracted towards the insulating surface and remove the metal oxides on the at least one surface of the component and are discharged upon reaching the conductive surface.

2. The apparatus of claim 1 wherein the material of the cathode is selected from a metal, an alloy, a semiconductor, an oxide coated substrate, or combination thereof.

3. The apparatus of claim 1 wherein the dielectric material comprises a ceramic material.

4. The apparatus of claim 1 wherein the anode is selected from an electrically conductive wire or an electrically conductive plate.

5. The apparatus of claim 1 wherein a pore size of the opening of the insulating plate ranges from 10 nanometers to 100 microns.

6. The apparatus of claim 1, wherein the material of the cathode comprises a refractory ceramic material.

* * * * *